(12) United States Patent
Cheng et al.

(10) Patent No.: US 9,293,532 B2
(45) Date of Patent: *Mar. 22, 2016

(54) GATE-ALL-AROUND NANOWIRE MOSFET AND METHOD OF FORMATION

(71) Applicant: GLOBALFOUNDRIES INC., Grand Cayman (KY)

(72) Inventors: Kangguo Cheng, Schenectady, NY (US); Bruce B. Doris, Slingerlands, NY (US); Pouya Hashemi, White Plains, NY (US); Ali Khakifirooz, Mountain View, CA (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/751,542

(22) Filed: Jun. 26, 2015

(65) Prior Publication Data

US 2015/0325664 A1    Nov. 12, 2015

Related U.S. Application Data

(63) Continuation of application No. 14/532,122, filed on Nov. 4, 2014, now abandoned, which is a continuation of application No. 14/046,069, filed on Oct. 4, 2013, now Pat. No. 8,969,934, which is a continuation of application No. 14/035,060, filed on Sep. 24, 2013, now Pat. No. 8,900,951.

(51) Int. Cl.
*H01L 21/8238* (2006.01)
*H01L 29/06* (2006.01)
(Continued)

(52) U.S. Cl.
CPC ........ *H01L 29/0673* (2013.01); *H01L 21/8238* (2013.01); *H01L 21/82385* (2013.01); *H01L 29/0649* (2013.01); *H01L 29/0669* (2013.01); *H01L 29/0676* (2013.01); *H01L 29/1033* (2013.01); *H01L 29/42392* (2013.01);
(Continued)

(58) Field of Classification Search
CPC . H01L 21/02109; H01L 21/70; H01L 21/702; H01L 21/71; H01L 21/8232
See application file for complete search history.

(56) References Cited

U.S. PATENT DOCUMENTS 8,080,456 B2    12/2011    Barwicz et al.
8,324,940 B2    12/2012    Bangsaruntip et al.
(Continued)

OTHER PUBLICATIONS

U.S. Appl. No. 14/751,493, Notice of Allowance dated Dec. 23, 2015, pp. 1-9.
(Continued)

*Primary Examiner* — Cheung Lee

(57) ABSTRACT

A method for fabricating a semiconductor device comprises forming a nanowire on an insulator layer at a surface of a substrate; forming a dummy gate over a portion of the nanowire and a portion of the insulator layer; forming recesses in the insulator layer on opposing sides of the dummy gate; forming spacers on opposing sides of the dummy gate; forming source regions and drain regions in the recesses in the insulator layer on opposing sides of the dummy gate; depositing an interlayer dielectric on the source regions and the drain regions; removing the dummy gate to form a trench; removing the insulator layer under the nanowire such that a width of the trench underneath the nanowire is equal to or less than a distance between the spacers; and forming a replacement gate in the trench.

18 Claims, 13 Drawing Sheets

(51) Int. Cl.
*H01L 29/66* (2006.01)
*H01L 51/00* (2006.01)
*H01L 29/49* (2006.01)
*H01L 29/775* (2006.01)
*H01L 29/423* (2006.01)
*H01L 29/51* (2006.01)
*H01L 29/10* (2006.01)
*H01L 29/786* (2006.01)
*H01L 29/08* (2006.01)

(52) U.S. Cl.
CPC .......... *H01L29/495* (2013.01); *H01L 29/4966* (2013.01); *H01L 29/4983* (2013.01); *H01L 29/51* (2013.01); *H01L 29/517* (2013.01); *H01L 29/518* (2013.01); *H01L 29/66439* (2013.01); *H01L 29/66545* (2013.01); *H01L 29/775* (2013.01); *H01L 29/78603* (2013.01); *H01L 29/78606* (2013.01); *H01L 51/0048* (2013.01); *H01L 29/0847* (2013.01)

(56) References Cited

U.S. PATENT DOCUMENTS

| | | | |
|---|---|---|---|
| 8,395,218 | B2 | 3/2013 | Suk et al. |
| 8,441,043 | B2 | 5/2013 | Bangsaruntip et al. |
| 2011/0291190 | A1 | 12/2011 | Xiao et al. |
| 2012/0007051 | A1 | 1/2012 | Bangsaruntip et al. |
| 2012/0329217 | A1 | 12/2012 | Bangsaruntip et al. |
| 2013/0105897 | A1 | 5/2013 | Bangsaruntip et al. |

OTHER PUBLICATIONS

U.S. Appl. No. 14/751,706, Notice of Allowance dated Dec. 24, 2015, pp. 1-9.
U.S. Appl. No. 14/751,761, Notice of Allowance dated Dec. 23, 2015, pp. 1-9.
U.S. Appl. No. 14/751,646, Notice of Allowance dated Jan. 12, 2016, pp. 1-9.

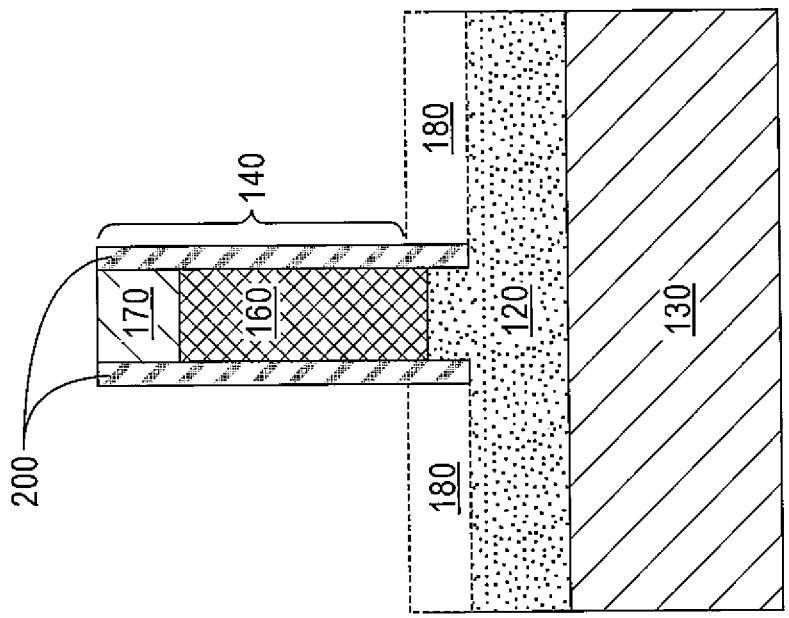
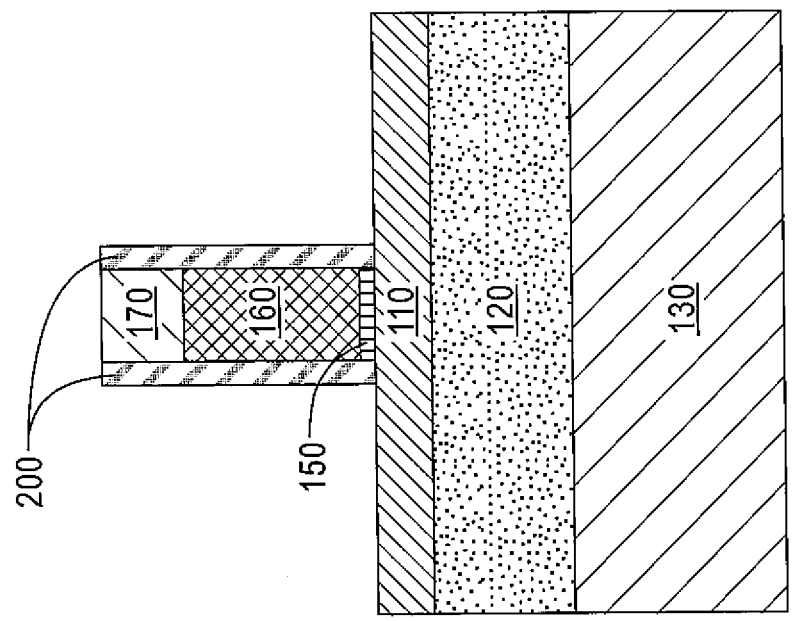

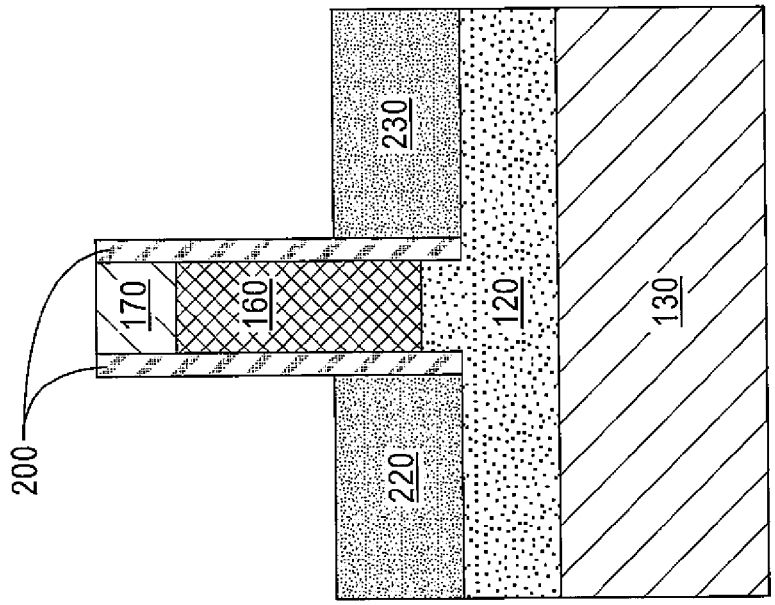
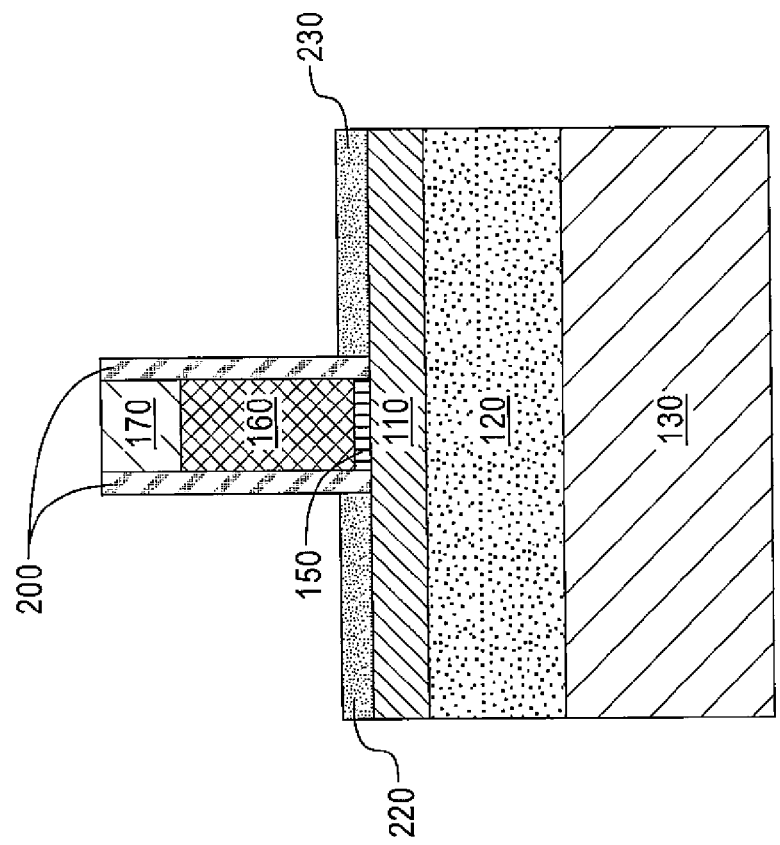

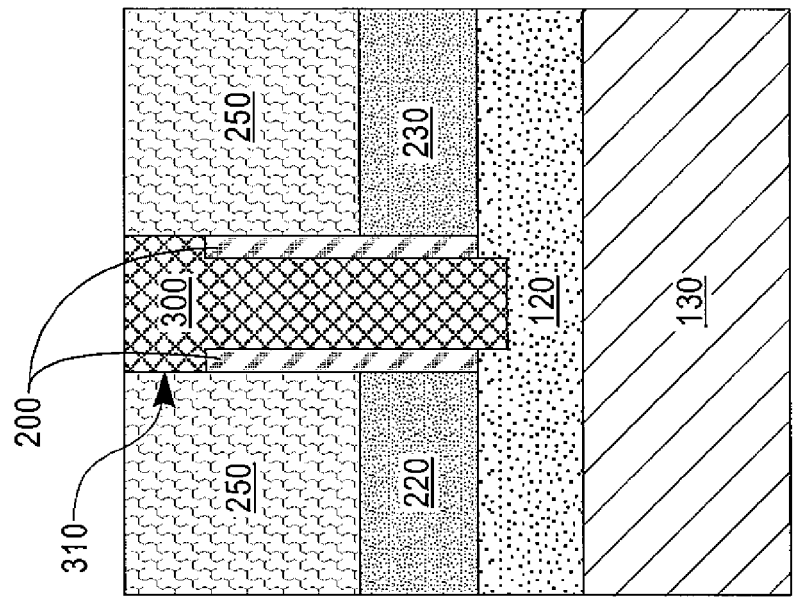
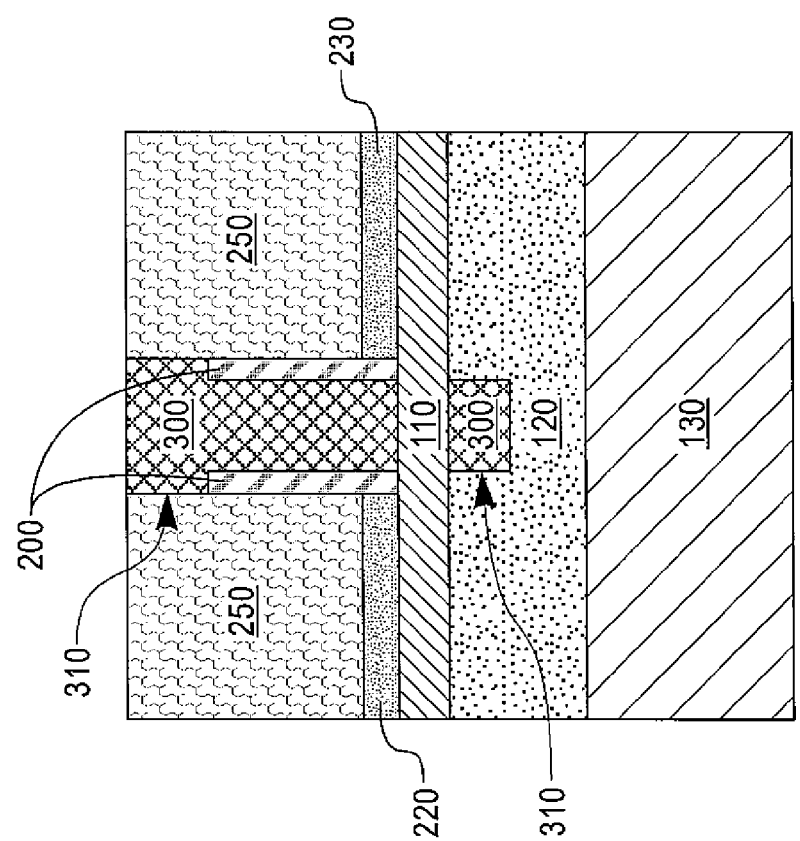
FIG. 10B
FIG. 10A

US 9,293,532 B2

GATE-ALL-AROUND NANOWIRE MOSFET AND METHOD OF FORMATION

CROSS REFERENCE TO RELATED APPLICATION

This application is a continuation of U.S. patent application Ser. No. 14/532,122, filed on Nov. 4, 2014, which is a continuation of U.S. patent application Ser. No. 14/046,069, filed on Oct. 4, 2013, which is a continuation of U.S. patent application Ser. No. 14/035,060, filed on Sep. 24, 2013, the contents of all of the foregoing applications being incorporated herein by reference in their entireties.

BACKGROUND

The exemplary embodiments of this invention relate generally to semiconductor devices and, more particularly, to a complementary metal oxide semiconductor device having a gate-all-around nanowire structure.

A complementary metal oxide semiconductor device (CMOS) uses symmetrically-oriented pairs of p-type and n-type metal oxide semiconductor field effect transistors (MOSFETs) arranged on silicon or silicon-on-insulator (SOI) substrates. Source and drain regions associated with each MOSFET are connected by a channel. A gate disposed adjacent the channel controls the flow of current between the source and drain regions. The channel may be defined by a thin "fin" or other structure that provides surface(s) through which the gate controls the flow of current.

In a device such as a gate-all-around (GAA) nanowire MOSFET, the channel between the source and drain regions is a nanowire, and the gate surrounds the nanowire. Formation of such a gate so as to wrap around the nanowire is a challenge. For example, it is often difficult (if not impossible) to pattern the portion of the gate that is located underneath the nanowire. Hence, the bottom portion of the gate may become longer than the top portion and may overlap the source and drain regions of the device.

In fabricating a GAA nanowire MOSFET, a dummy gate is generally formed as a sacrificial structure to facilitate patterning to achieve a desired alignment and/or the implantation of ions for doping purposes. A replacement gate flow is then used to remove the dummy gate and install a permanent replacement gate. In the replacement gate flow, the dummy gate is patterned. The nanowire is then released from the dummy gate by the removal of the dummy gate. In removing the dummy gate, the material underneath the nanowire is undercut to cause the complete release of the wire from the material of the dummy gate and to form an opening that can be filled with a GAA structure. However, the undercutting also extends the opening in the directions toward the source and drain, thereby adding to the parasitic capacitance of the MOSFET.

BRIEF SUMMARY

In one exemplary aspect, a method for fabricating a semiconductor device comprises forming a nanowire on an insulator layer at a surface of a substrate; forming a dummy gate over a portion of the nanowire and a portion of the insulator layer; forming recesses in the insulator layer on opposing sides of the dummy gate; forming spacers on opposing sides of the dummy gate; forming source regions and drain regions in the recesses in the insulator layer on opposing sides of the dummy gate; depositing an interlayer dielectric on the source regions and the drain regions; removing the dummy gate to form a trench; removing the insulator layer under the nanowire such that a width of the trench underneath the nanowire is equal to or less than a distance between the spacers; and forming a replacement gate in the trench.

In another exemplary aspect, a method for fabricating a semiconductor device comprises forming a dummy gate stack over a portion of and substantially transverse to a nanowire on a silicon-on-insulator wafer; forming recesses in the silicon-on-insulator wafer on opposing sides of the dummy gate stack; forming spacers in the recesses on opposing sides of the dummy gate stack; forming source regions and drain regions on opposing sides of the spacers; depositing an interlayer dielectric on the source regions and the drain regions; planarizing an upper surface defined by the interlayer dielectric, upper edges of the spacers, and an upper surface of the dummy gate stack; removing the dummy gate stack; removing a portion of the silicon-on-insulator wafer underneath the dummy gate stack, underneath the nanowire, and between inner facing surfaces of the spacers; and forming a replacement gate in place of the dummy gate stack, the replacement gate extending at least under the nanowire to form a gate-all-around structure and extending between the inner facing surfaces of the spacers.

In another exemplary aspect, an apparatus for a semiconductor device comprises a nanowire formed on an insulator layer disposed on a substrate of semiconductor material, a first end of the nanowire being in communication with a source region and a second end of the nanowire being in communication with a drain region; and a gate positioned across and extending substantially transverse to the nanowire between the source region and the drain region, the gate comprising an electrode and spacers positioned on opposing sides of the electrode and extending substantially transverse to the nanowire. A bottom portion of the gate surrounds a portion of the nanowire extending from the source region to the drain region, and outer surfaces of the gate extend vertically downward into the insulator layer but do not extend beyond the inner faces of the spacers toward the source region and the drain region.

BRIEF DESCRIPTION OF THE SEVERAL VIEWS OF THE DRAWINGS

The foregoing and other aspects of the exemplary embodiments are made more evident in the following Detailed Description, when read in conjunction with the attached Drawing Figures, wherein:

FIG. 5A is a side view along cross section A-A' during a step of forming a spacer on the dummy gate stack in the fabrication of the apparatus;

FIG. 5B is a side view along cross section B-B' during the step of forming the spacer on the dummy gate stack in the fabrication of the apparatus;

FIG. 6A is a side view along cross section A-A' during a step of forming source/drain regions in the fabrication of the apparatus;

FIG. 6B is a side view along cross section B-B' during the step of forming source/drain regions in the fabrication of the apparatus;

FIG. 10A is a side view along cross section A-A' during a step of forming a replacement gate in the fabrication of the apparatus;

FIG. 10B is a side view along cross section B-B' during the step of forming the replacement gate in the fabrication of the apparatus;

DETAILED DESCRIPTION

In the exemplary embodiments disclosed herein, GAA nanowire architecture is used in the fabrication of a CMOS such as a MOSFET to allow for improved electrostatic gate control in a conducting channel and to offer the potential to drive more current per device area than is possible in conventional planar CMOS architectures. In implementing the GAA nanowire architecture, a dummy gate comprising an oxide material is formed over a nanowire so as to extend substantially transverse to the nanowire. Lower portions of the dummy gate extend below and underneath the nanowire and into a surface on which the nanowire is disposed. Upper portions of the material of the dummy gate are removed, and lower portions of the material of the dummy gate (the oxide under the nanowire extending between source and drain regions) are recessed and undercut. Spacers are then formed on opposing sides of the dummy gate. When the oxide is undercut after removal of the upper portions of the dummy gate, the lateral extent of the opening is limited by the presence of the spacers.

Figure 1:
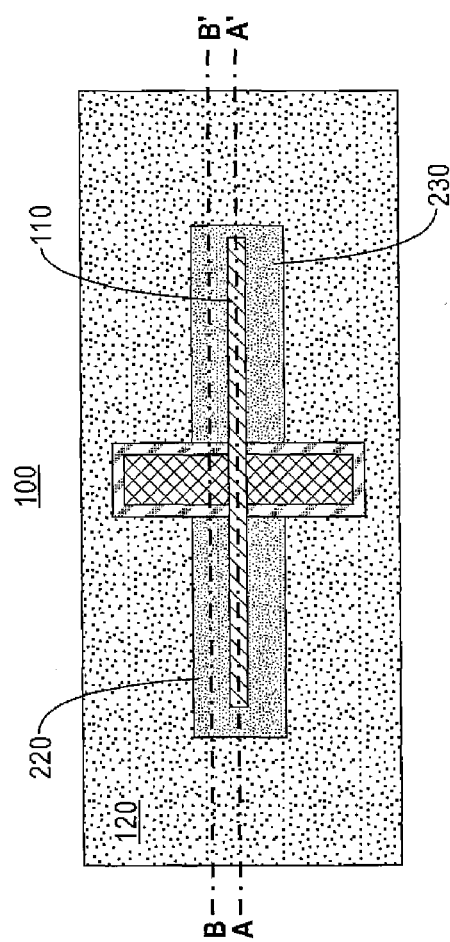
FIG. 1 is a to sectional view of one exemplary embodiment of an apparatus incorporating GAA nanowire architecture in which a gate is positioned transverse to a nanowire.

Referring to FIG. 1, a GAA nanowire structure for a MOSFET is designated generally by the reference number 100 and is hereinafter referred to as "apparatus 100." Apparatus 100 comprises a nanowire 110 generally laterally disposed on an insulator layer 120, the insulator layer 120 being disposed on a substrate (shown at 130 in FIGS. 2A-10B). Cross section A-A' is parallel to and coincident with the nanowire 110, and cross section B-B' is parallel to the nanowire 110 and between the nanowire 110 and a second nanowire (not shown) positioned parallel to and distal from the nanowire 110. In the finished apparatus 100, the insulator layer 120 may be a buried oxide (BOX) layer. In an exemplary embodiment, the nanowire 110 may be epitaxially grown on the insulator layer 120 using chemical vapor deposition (CVD) or any other suitable method. Source regions 220 and drain regions 230 are deposited on and adjacent to the nanowire 110 by epitaxy.

Figure 2B:
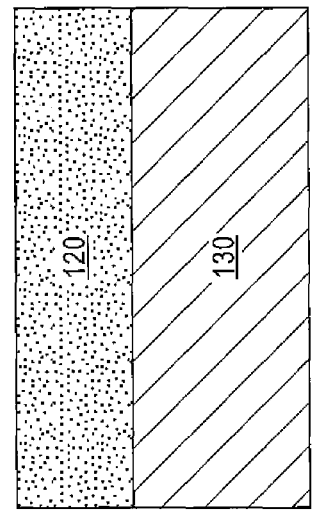
FIG. 2B is a side view along cross section B-B' of FIG. 1 during a step in the fabrication of the apparatus.
Figure 2A:
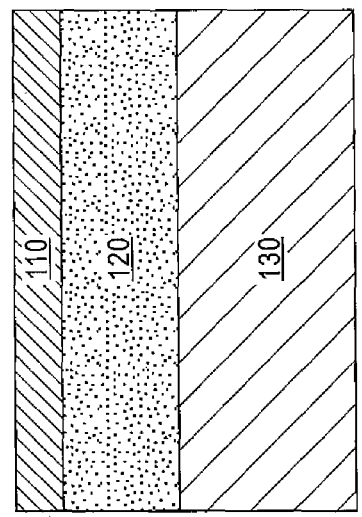
FIG. 2A is a side view along cross section A-A' of FIG. 1 during a step in the fabrication of the apparatus.

Referring now to FIG. 2A, one or more patterns are laid out for the epitaxial growth (or other formation) of nanowires 110 as channels on the insulator layer 120 of a silicon-on-insulator (SOI) wafer. The nanowire 110 is patterned onto the insulator layer 120 by any suitable method. Methods by which the nanowire may be patterned onto the insulator layer 120 include, but are not limited to, lithographic techniques such as atomic force microscope (AFM) nano-oxidation and selective wet etching, E-beam lithography, and X-ray lithography.

The SOI wafer is defined by the substrate 130 and the insulator layer 120. The substrate 130 may comprise any semiconducting material such as, for example, silicon carbide (SiC), silicon alloys, germanium, germanium alloys, alloys of silicon and germanium ($Si_xGe_y$), gallium arsenide (GaAs), indium arsenide (InAs), indium phosphide (InP), and the like. The insulator layer 120 may comprise, for example, silicon dioxide ($SiO_2$) or the like.

The one or more nanowires 110 are then epitaxially grown to form the channels. The nanowire 110 may comprise silicon, germanium, boron-doped germanium, or any other suitable material.

As shown in FIG. 2B, a nanowire is not patterned onto the insulator layer 120 on a portion of the insulator layer 120 along the cross section B-B' parallel to the nanowire 110 and between the nanowire 110 and a second nanowire.

Figure 3A:
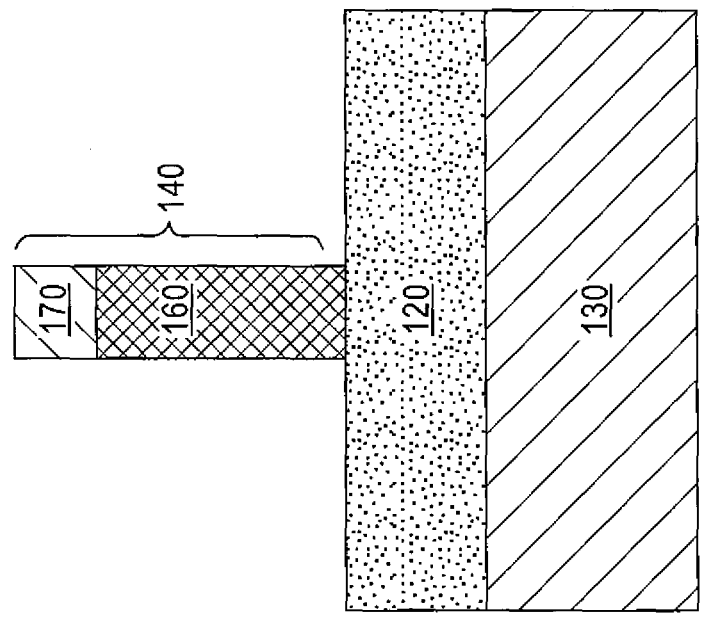
FIG. 3A is a side view along cross section A-A' during a step of forming a dummy gate stack over a nanowire in the fabrication of the apparatus.
Figure 3B:
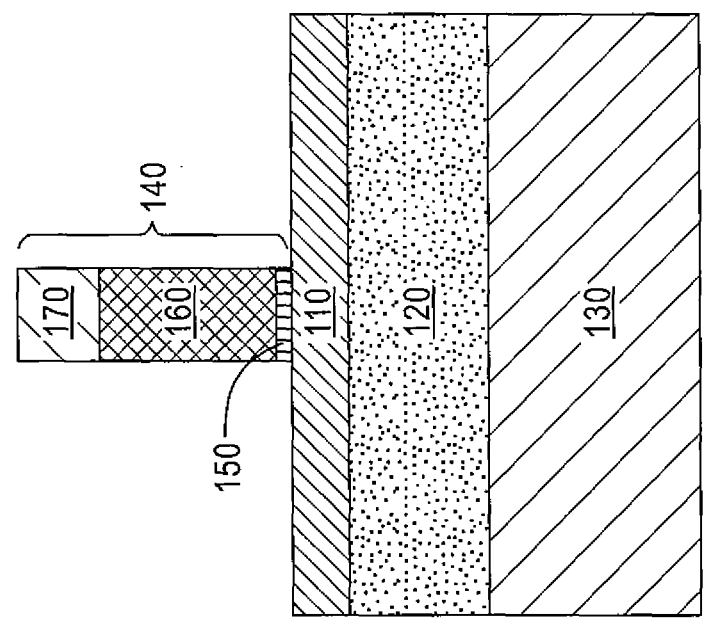
FIG. 3B is a side view along cross section B-B' during the step of forming the dummy gate stack in the fabrication of the apparatus.

Referring now to FIGS. 3A and 3B, a dummy gate stack 140 is formed both on the nanowire 110 (FIG. 3A) and on the insulator layer 120 (FIG. 3B). The dummy gate stack 140 may be substantially transverse to the nanowire 110. In forming the dummy gate stack 140 across the nanowire 110, a dielectric layer 150 is deposited or grown, on a surface of the nanowire 110. This dielectric layer 150 comprises, for example, $SiO_2$, alumina ($Al_2O_3$), tantalum pentoxide ($Ta_2O_5$), hafnium dioxide ($HfO_2$), or the like, deposited onto the nanowire 110 by, for example, thermal oxidation, atmospheric pressure CVD (APCVD), low pressure CVD (LPCVD), sputtering techniques, or electron-beam deposition.

Subsequent to the deposition or growth of the dielectric layer 150, a dummy gate electrode 160 is deposited onto the dielectric layer 150 and onto the insulator layer 120. The dummy gate electrode 160 may comprise, for example, polysilicon (or metal or a combination of polysilicon and metal) and may be deposited via LPCVD or any other suitable method.

Subsequent to the deposition of the dummy gate electrode 160, a dummy gate cap 170 is deposited onto the dummy gate electrode 160. The dummy gate cap 170 may comprise, for example, a nitride (silicon nitride, carbon nitride, or the like) or a silicide and may be deposited via LPCVD.

Figure 4B:
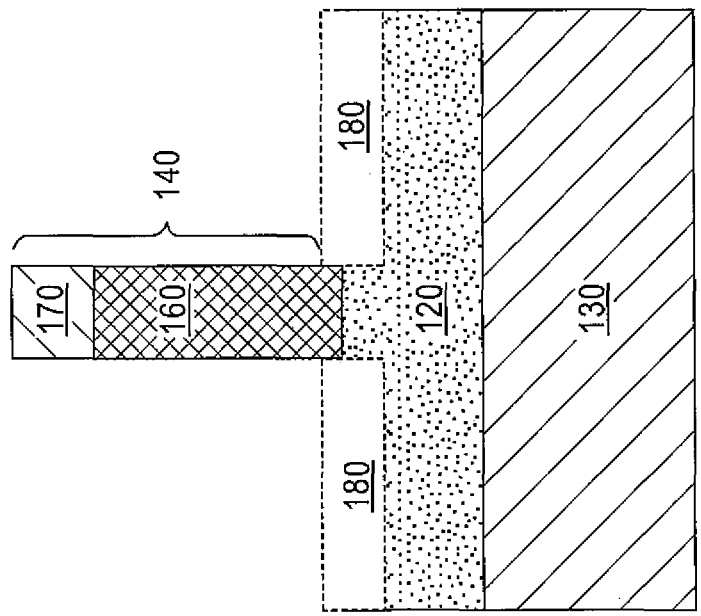
FIG. 4B is a side view along cross section B-B' during the step of etching the insulator layer in the fabrication of the apparatus.
Figure 4A:
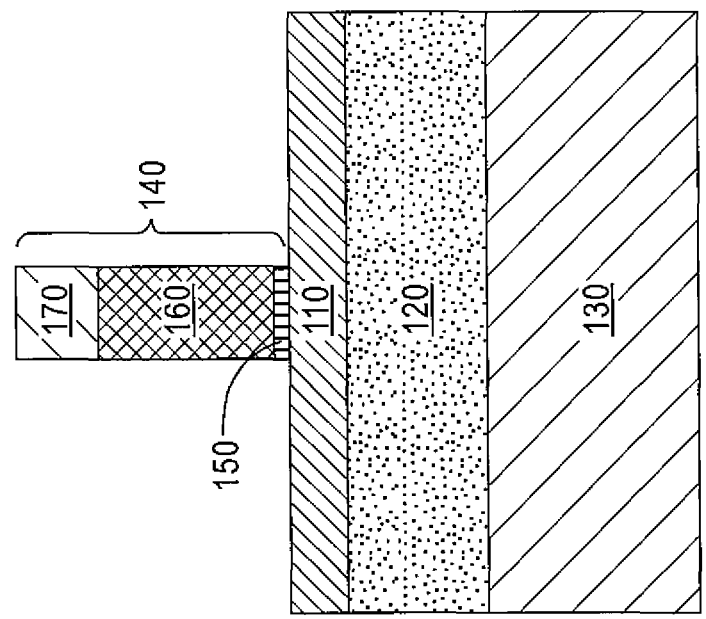
FIG. 4A is a side view along cross section A-A' during a step of etching an insulator layer in the fabrication of the apparatus.

Referring now to FIGS. 4A and 4B, the material of the insulator layer 120 (e.g., the $SiO_2$) is etched vertically. As shown in FIG. 4A, the dummy gate stack 140 and the nanowire 110 are used as a mask to prevent the etching of the insulator layer 120 underneath the dummy gate stack 140 and the nanowire 110. As shown in FIG. 4B, the material of the insulator layer 120 is removed by the etch to form recesses 180. Etching of the insulator layer 120 to form the recesses 180 may be effected by wet etch techniques (e.g., polyphosphoric acids, hydrofluoric acid (HF), potassium hydroxide, or the like) or plasma or gas etch techniques. Irrespective of the technique used to etch, the material of the insulator layer 120 is recessed vertically from the outer surfaces of the dummy gate stack 140 such that the insulator layer 120 directly under the dummy gate 120 is not removed.

Once the recesses 180 are formed in the insulator layer 120, spacers 200 are formed on opposing sides of the dummy gate stack 140, as shown in FIGS. 5A and 5B. Along the cross section A-A', the spacers 200 extend from the top of the dummy gate cap 170 to the nanowire 110. Between the nanowire 110 and adjacent nanowires, however, the spacers 200 extend to a depth below the bottom of the nanowire 110 and the dummy gate stack 140 (to the bottom surfaces defined by the recesses 180). The spacers 200 are formed by masking off the nanowire 110 and the insulator layer 120 and depositing dielectric material, such as $SiO_2$, silicon nitride, low-permittivity (low-K) dielectrics such as $SiO_xN_y$, or boron nitride, via CVD or LPCVD.

Referring now to FIGS. 6A and 6B, a source and a drain may be formed by a selective epitaxial growth process such as vapor phase epitaxy, which is a form of CVD. Epitaxial growth refers to the deposition of a crystalline overlayer on a crystalline sub-layer where the structure of the overlayer registers with the structure of the crystalline sub-layer. As can be seen in FIG. 6A, a layer of source material and drain material is epitaxially grown on opposing sides of the dummy gate stack 140 and over the nanowire 110 to form the source regions 220 and drain regions 230. As can be seen in FIG. 6B, a layer of the material used to grow the source regions 220 and the drain regions 230 is also epitaxially grown on the insulator layer 120 at opposing sides of the dummy gate stack 140 and over the cross section B-B' parallel to the nanowire 110 and between the nanowire 110 and a second nanowire.

Figure 7B:
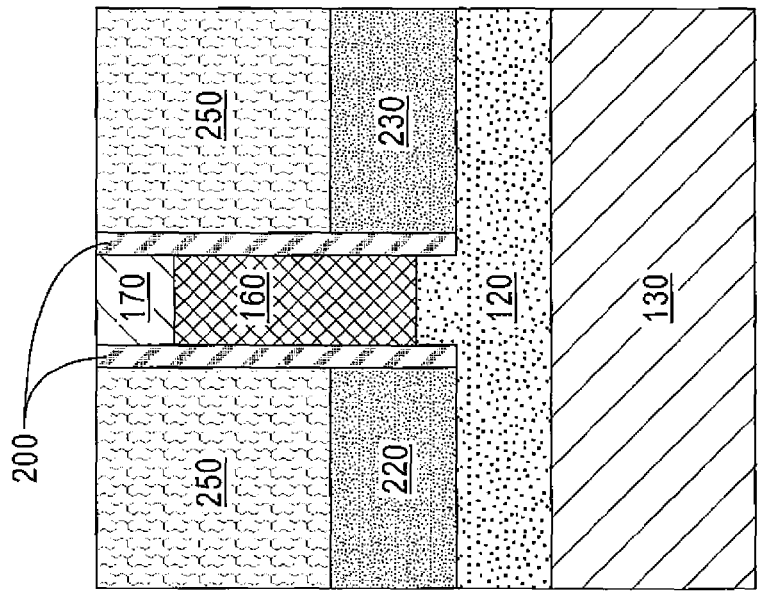
FIG. 7B is a side view along cross section B-B' during the step of depositing the interlayer dielectric and applying the chemical mechanical polish in the fabrication of the apparatus.
Figure 7A:
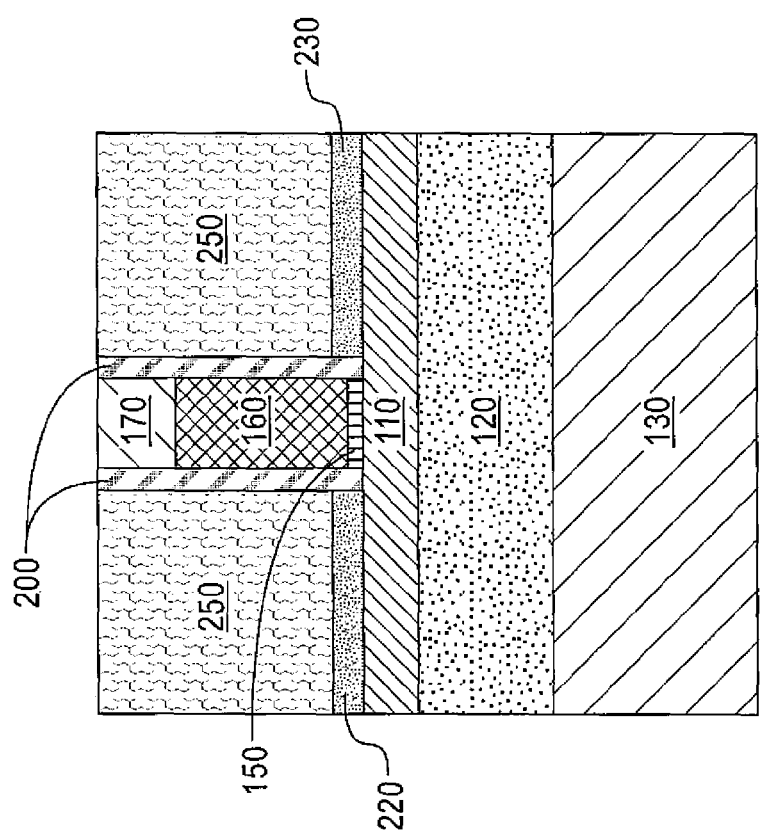
FIG. 7A is a side view along cross section A-A' during a step of depositing an interlayer dielectric and applying a chemical mechanical polish in the fabrication of the apparatus.

As shown in FIGS. 7A and 7B, an interlayer dielectric (ILD) 250 is deposited onto the epitaxially grown source regions 220 and drain regions 230 by CVD. The resulting structure is then planarized using a chemical mechanical polish (CMP). Materials from which the ILD 250 may be formed include oxides such as $SiO_2$.

Figure 8B:
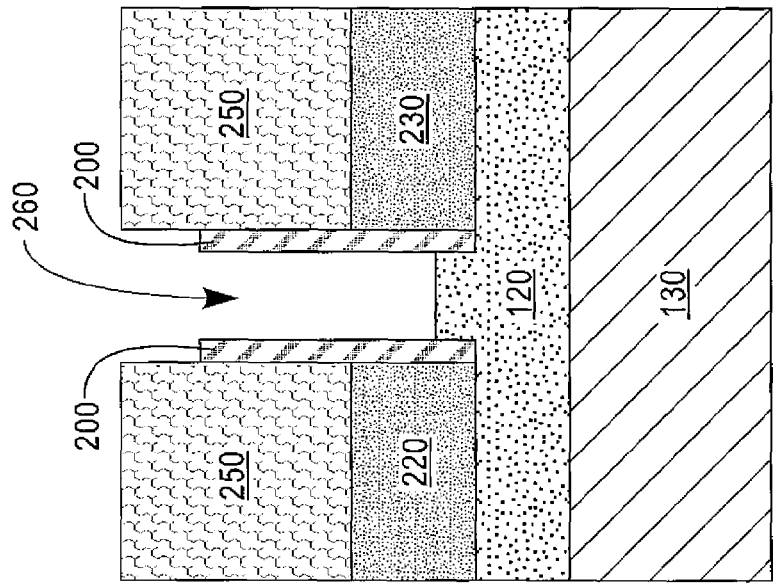
FIG. 8B is a side view along cross section B-B' during the step of removing the dummy gate in the fabrication of the apparatus.
Figure 8A:
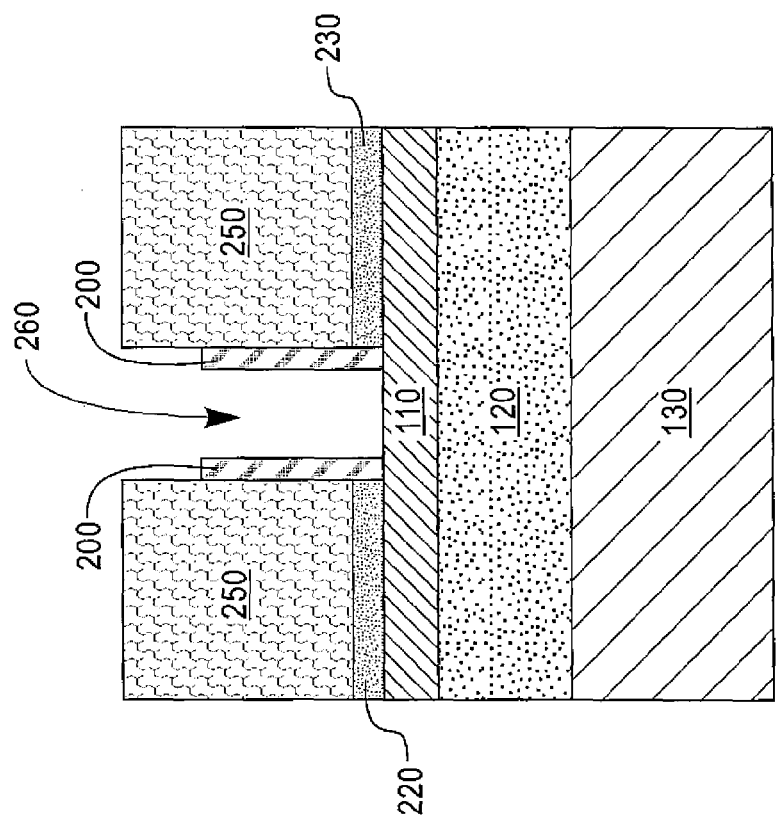
FIG. 8A is a side view along cross section A-A' during a step of removing the dummy gate in the fabrication of the apparatus.

Referring now to FIGS. 8A and 8B, the dummy gate cap 170 and the dummy gate electrode 160 are removed in an etching process that comprises one or more of a dry etch process (e.g., a reactive ion etch (RIE), plasma etching, or the like) and a wet etch process using phosphoric acid ($H_3PO_4$). Preferably, the dummy gate cap 170 is removed using the dry etch process. Once the dummy gate cap 170 is removed, the dummy gate electrode 160 is removed using the RIE. Top portions of the spacers 200 are removed down to the bottom surface of the dummy gate cap 170, but bottom portions of the spacers 200 remain in the ILD 250. Etching in the vertical direction is then carried out along with an isotropic etch (such as aqueous HF, dilute aqueous HF, HF vapor, buffered oxide etch (e.g., $NH_4F$:HF), or the like) to remove the dielectric layer 150 (the oxide) and portions of the insulator layer 120 down to a depth at or below a bottom surface of the nanowire 110 and between the spacers. The dry etch process and/or the wet etch process along with the isotropic etch forms a trench 260 that extends in the insulator layer 120 transverse to cross section A-A' and cross section B-B' and leaves portions of the nanowire(s) 110 extending between the spacer 200 exposed.

Figure 9A:
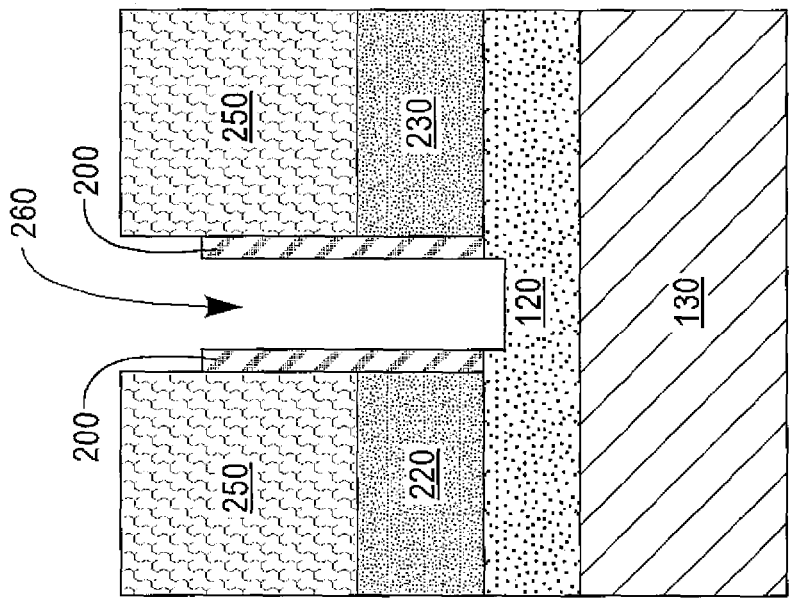
FIG. 9A is a side view along cross section A-A' during a step of undercutting the nanowire in the fabrication of the apparatus.
Figure 9B:
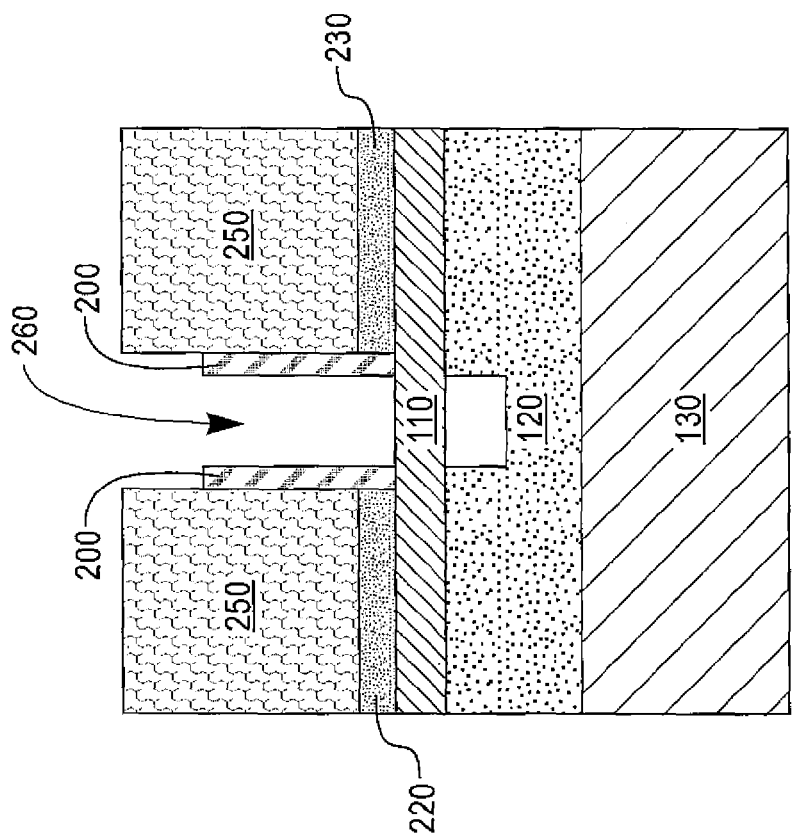
FIG. 9B is a side view along cross section B-B' during the step of removing portions of the insulator layer in the fabrication of the apparatus.

As shown in FIG. 9A, further isotropic etching results in additional insulator layer 120 being removed and the nanowire 110 being undercut such that the bottom portion of the nanowire 110 is released from the source regions 220 and the drain regions 230. Thus, the nanowire 110 is essentially suspended between the source region 220 and the drain region 230. The sides of the opening formed under the nanowire 110 by the isotropic etch are substantially coplanar with the inner facing surfaces of the spacers 200, which are formed before the nanowire is suspended between the source regions 220 and the drain regions 230. As shown in FIG. 9B, lateral undercutting of the insulator layer 120 is prevented or at least limited by the spacers 200.

Referring now to FIGS. 10A and 10B, a replacement gate 300 is formed in the space between the spacers 200. In a first step in forming the replacement gate 300 (which may be a replacement metal gate (RMG)), a layer 310 of high-k dielectric material is deposited on the surfaces defining the opening between the spacers 200 as well as on nanowire 110 (FIG. 10A). This layer 310 of high-k dielectric material may be deposited by, for example, CVD. The high-k dielectric material may be, for example, oxide(s) of tantalum, zirconium, or aluminum, as well as $SiO_2$ or $Al_3N_4$.

Figure 11B:
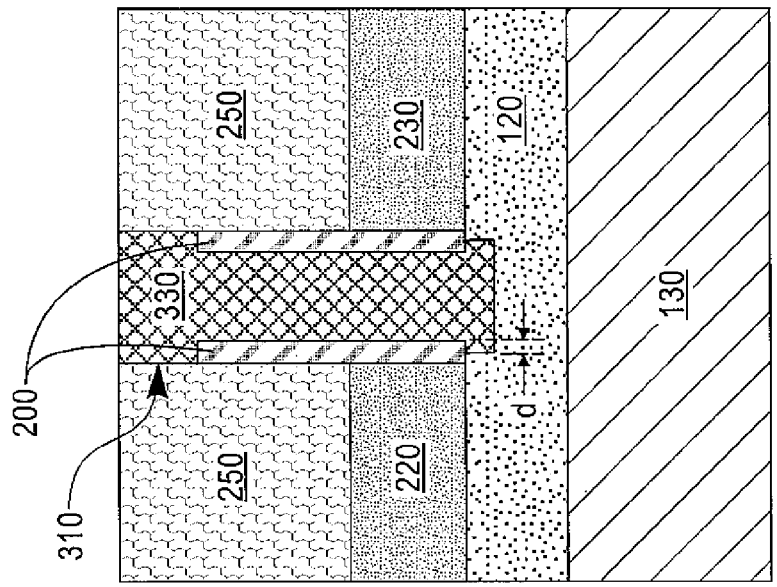
FIG. 11B is a cross sectional side view of the prior art apparatus of FIG. 11A in which during undercutting of the insulating layer, the insulating layer was laterally etched underneath spacers of the apparatus.
Figure 11A:
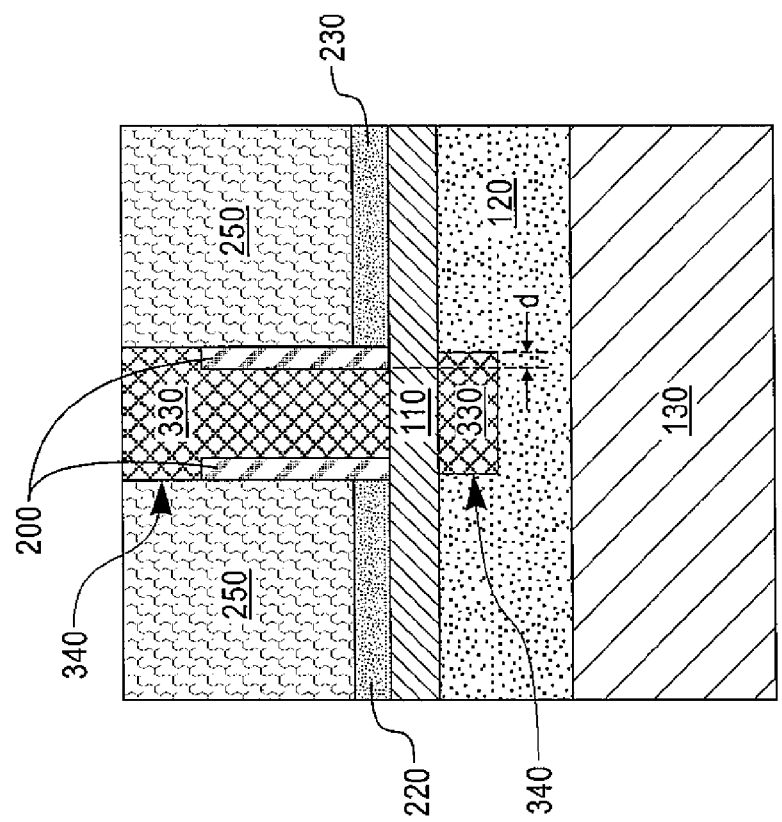
FIG. 11A is a cross sectional side view of a prior art apparatus taken along a nanowire in which during undercutting of an insulating layer, the insulating layer was laterally etched underneath spacers of the apparatus.

In a second step of forming the replacement gate 300, a gate metal is deposited on the layer 310 of high-k dielectric material. The gate metal is preferably aluminum, nickel, tantalum, tantalum nitride, titanium, titanium nitride, TiAl alloy, ruthenium, tungsten, or the like and is deposited on the high-k dielectric material via vapor deposition. Formation of the replacement gate 300 as indicated is different than the formation of similar gates in the known art, as shown in FIGS. 11A and 11B, in which portions of a gate 330 and/or a layer 340 of dielectric material extend laterally underneath spacers 200 by a distance d. In the formation of the replacement gate 300 as in FIGS. 10A and 10B (and similar gates) to form the GAA structure, the oxide layer is laterally etched during the undercutting process. Compared to the gate 330 as shown in FIGS. 11A and 11B, the portion of the replacement gate 300 under the nanowire 110 and between the nanowires is narrower.

Figure 12A:
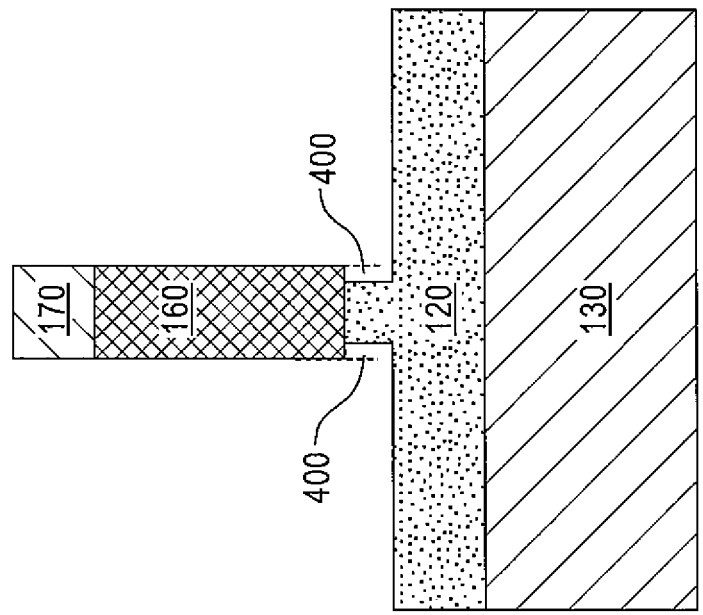
FIG. 12A is a side view along cross section A-A' during a step of forming a second exemplary embodiment of an apparatus in which the source/drain regions undercut the gate stack and the nanowire.
Figure 12B:
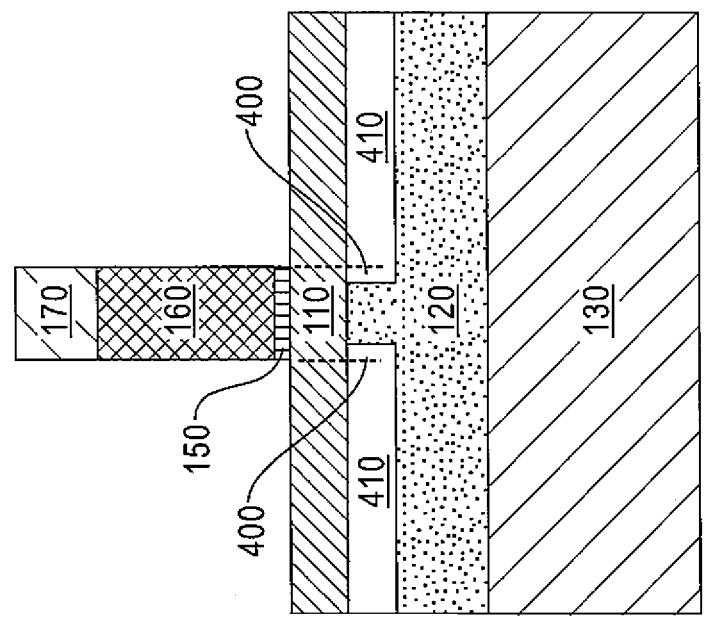
FIG. 12B is a side view along cross section B-B' during the step of forming the second exemplary embodiment of the apparatus in which the source/drain regions undercut the gate stack.

In another exemplary embodiment, as shown in FIGS. 12A and 12B, the material of the source regions 220 and the drain regions 230 is subjected to a vertical etching process along with an isotropic etching process (oxide undercutting) carried out in lateral directions to form recesses (shown at 400) underneath the dummy gate stack 140 as well as recesses (shown at 410) underneath the nanowire 110 in outward directions toward the source region 220 and the drain regions 230. Depending upon the extent of the undercutting of dummy gate stack 140, portions of the nanowire 110 (FIG. 12A) may or may not be completely released.

Figure 13B:
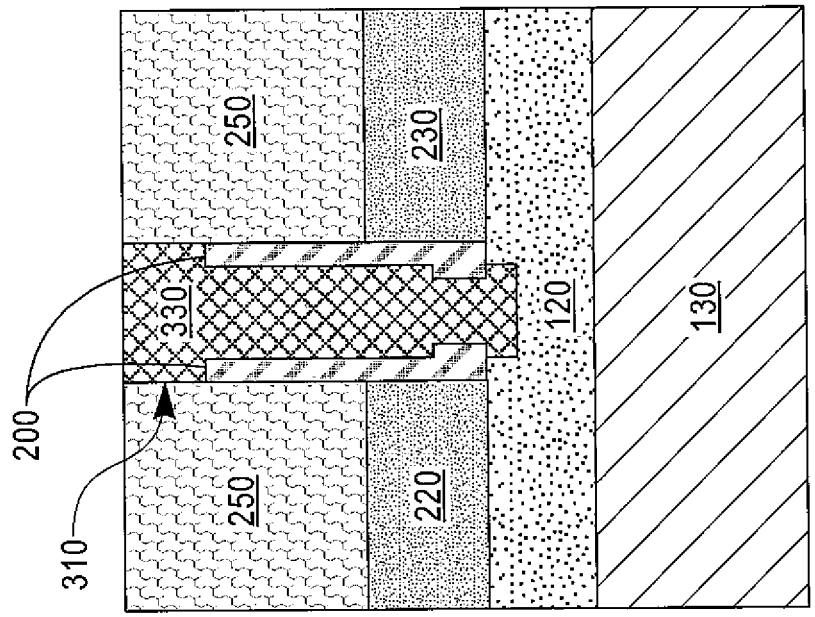
FIG. 13B is a side view along cross section B-B' during the step of extending the spacers under the gate stack.
Figure 13A:
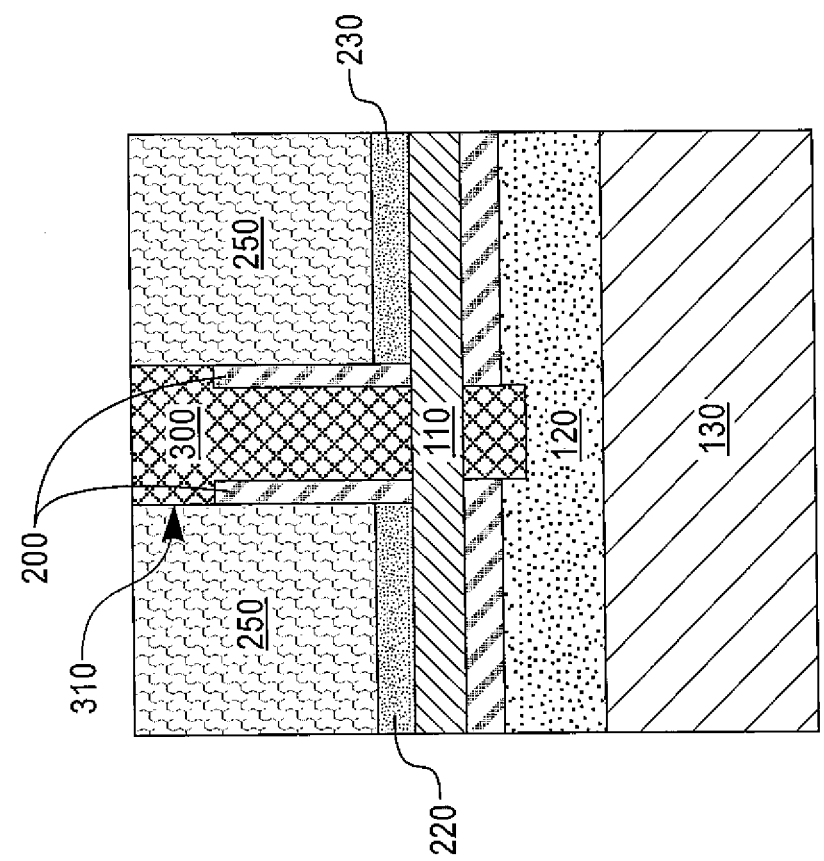
FIG. 13A is a side view along cross section A-A' during a step of extending the spacers under the nanowire.

Referring now to FIGS. 13A and 13B, lower portions of the spacers 200 along cross section A-A' are extended under the nanowire 110 (FIG. 13A) both inwardly of the gate region to fill the recesses 400 as well as in the outward directions underneath the nanowire 110 toward the source region 220 and the drain region 230. Lower portions of the spacers 200 between nanowires (e.g., along cross section B-B') are laterally extended into the recesses 400. The layer 310 of high-k dielectric material is deposited, and the replacement gate 300 is formed on the layer 310 of high-k dielectric material. In such an embodiment, portions of the replacement gate 300 under the nanowire 110 both directly under the nanowire 110 and in the spaces between nanowires are narrower as compared to gates in the known art.

Figure 14:
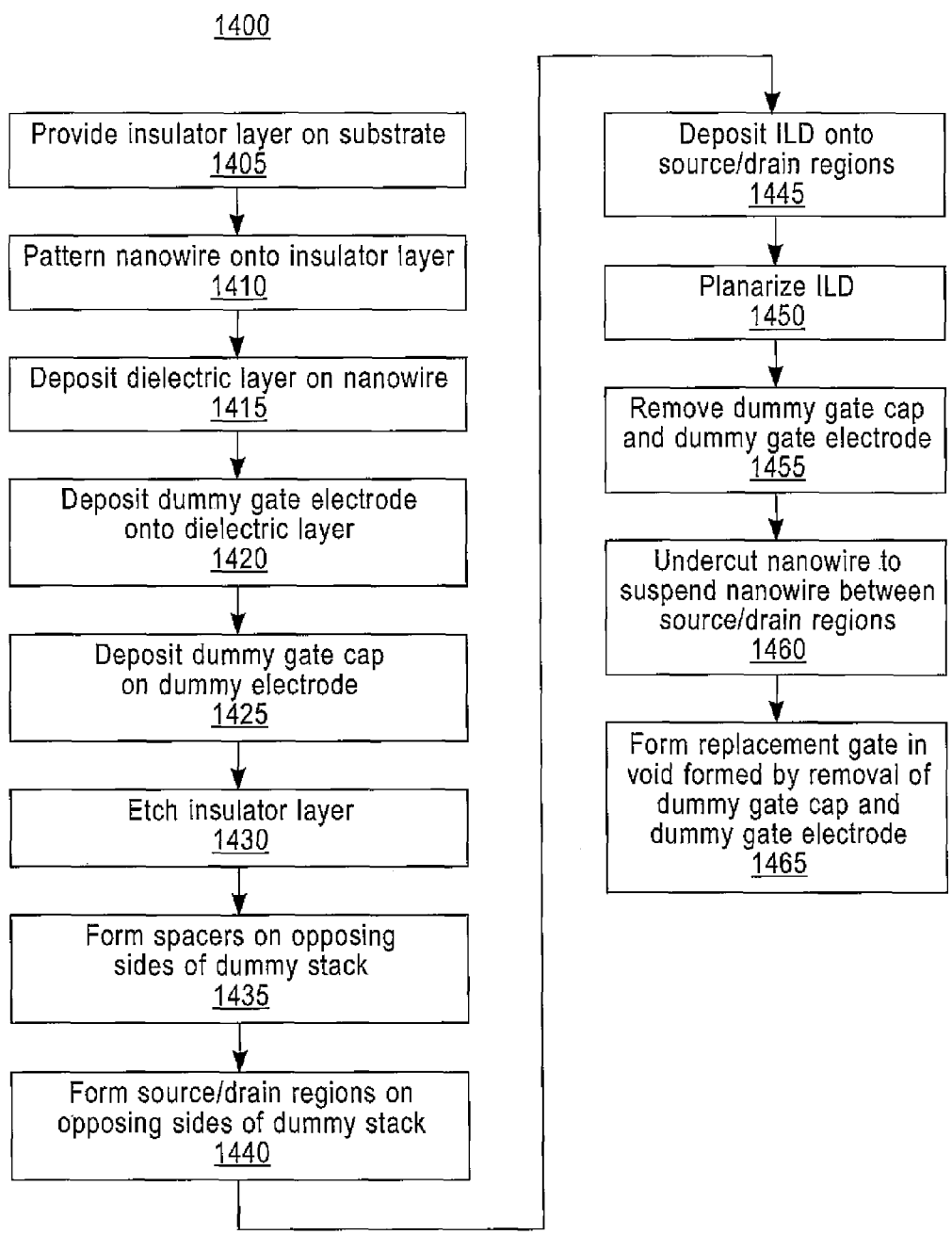
FIG. 14 is a flow of a method of forming a GAA nanowire structure.

Referring now to FIG. 14, one exemplary a method of forming a GAA nanowire structure is designated generally by the reference number 1400 and is hereinafter referred to as "method 1400." Method 1400 comprises a providing step 1405 in which an insulator layer is generally provided on a substrate. After the providing step 1405, a nanowire is patterned onto the insulator layer in a patterning step 1410. A dielectric layer is then deposited onto the nanowire in a dielectric layer deposit step 1415. A dummy gate electrode is then deposited onto the dielectric layer in a dummy gate electrode deposit step 1420. A dummy gate cap is then deposited onto the dummy gate electrode in a dummy gate cap deposit step 1425. The insulator layer is then etched in an insulator layer etch step 1430, and spacers are formed on opposing sides of the dummy stack in a spacer formation step 1435. Source and drain regions are then formed on opposing sides of the dummy stack in a source/drain region formation step 1440. An ILD layer is deposited onto the source/drain regions in an ILD deposit step 1445, and the ILD is planarized in a planarize step 1450. The dummy gate cap and dummy gate electrode are then removed in a removal step 1455, and the nanowire is undercut in an undercutting step 1460 to cause the nanowire to be suspended between the source/drain regions. Following the undercutting step 1460, a replacement gate is formed in a replacement gate formation step 1465.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical applications, and to enable others of ordinary skill in the art to understand the invention for various embodiments with various modifications as are suited to the particular uses contemplated.

The invention claimed is:

1. A gate-all-around structure for a semiconductor device, comprising:
    a substrate;
    an insulator layer disposed on the substrate;
    a nanowire substantially laterally disposed on the insulator layer;
    a source region disposed in communication with a first end of the nanowire;
    a drain region disposed in communication with a second end of the nanowire;
    a gate positioned substantially transverse to the nanowire, a bottom portion of the gate surrounds a portion of the nanowire between the source region and the drain region, and wherein the width of the bottom portion of the gate is less than the width of a top portion of the gate; and
    a layer of high-k dielectric material disposed on the nanowire between the gate and the nanowire;
    wherein the gate comprises a gate metal disposed on the layer of high-k dielectric material.

2. The structure of claim 1, further comprising spacers positioned on opposing sides of the gate.

3. The structure of claim 2, wherein inner facing surfaces on lower portions of the spacers extend laterally inward.

4. The structure of claim 3, wherein outward facing surfaces on lower portions of the spacers extend laterally outward underneath the nanowires.

5. The structure of claim 2, wherein the spacers comprise $SiO_2$, silicon nitride, $SiO_xN_y$, or boron nitride.

6. The structure of claim 1, wherein the gate metal comprises aluminum, nickel, tantalum, tantalum nitride, titanium, titanium nitride, TiAl alloy, ruthenium, or tungsten.

7. The structure of claim 1, wherein the high-k dielectric material is tantalum oxide, zirconium oxide, aluminum oxide, $SiO_2$, or $Al_3N_4$.

8. The structure of claim 1, wherein the substrate and the insulator layer define a silicon-on-insulator wafer.

9. The structure of claim 1, wherein the substrate comprises silicon carbide, a silicon alloy, germanium, germanium alloy, alloy of silicon and germanium, gallium arsenide, indium arsenide, or indium phosphide.

10. The structure of claim 1, wherein the insulator layer comprises silicon dioxide.

11. The structure of claim 1, further comprising an interlayer dielectric material disposed on the source region and the drain region.

12. A gate-all-around structure for a semiconductor device, comprising:
    a substrate having an insulator layer disposed thereon;
    a nanowire substantially laterally disposed on the insulator layer;
    a source region disposed in communication with a first end of the nanowire;
    a drain region disposed in communication with a second end of the nanowire;
    a layer of high-k dielectric material disposed on the nanowire; and
    a gate positioned substantially transverse to the nanowire and on the layer of high-k dielectric material and spacers positioned on opposing sides of the gate, and a bottom portion of the gate surrounds a portion of the nanowire between the source region and the drain region, wherein the bottom portion of the gate under the nanowire is narrower than a top portion of the gate above the nanowire, and wherein the gate comprises a gate metal disposed on the layer of high-k dielectric material.

13. The structure of claim 12, wherein inner facing surfaces at bottom portions of the spacers extend inward into the gate.

14. The structure of claim 13, wherein outward facing surfaces at bottom portions of the spacers extend outward underneath the nanowires.

15. The structure of claim 12, wherein the high-k dielectric material disposed on the nanowire is tantalum oxide, zirconium oxide, aluminum oxide, $SiO_2$, or $Al_3N_4$.

16. The structure of claim 12, wherein the gate metal comprises aluminum, nickel, tantalum, tantalum nitride, titanium, titanium nitride, TiAl alloy, ruthenium, or tungsten.

17. The structure of claim 12, wherein the insulator layer is a buried oxide layer.

18. The structure of claim 12, further comprising an interlayer dielectric material disposed on the source region and the drain region.

* * * * *